United States Patent
Kataoka (10) Patent No.: US 6,897,165 B2
(45) Date of Patent: May 24, 2005

(54) ENVIRONMENTAL CONTROL EQUIPMENT/ METHOD OF DEVELOPING APPARATUS FOR DEVELOPING LIGHT-EXPOSED RESIST FILM WITH DEVELOPER IN WAFER TREATING CHAMBER

(75) Inventor: Masao Kataoka, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 210 days.

(21) Appl. No.: 10/160,105

(22) Filed: Jun. 4, 2002

(65) Prior Publication Data

US 2002/0197867 A1 Dec. 26, 2002

(30) Foreign Application Priority Data

Jun. 6, 2001 (JP) ........................................ 2001-171362

(51) Int. Cl.[7] ............................ H01L 21/47; B01L 1/04; F24F 3/16
(52) U.S. Cl. ........................... 438/780; 96/111; 454/187
(58) Field of Search ............................... 438/780, 909; 96/109, 111; 454/187

(56) References Cited

U.S. PATENT DOCUMENTS

| | | | | |
|---|---|---|---|---|
| 5,452,052 A | * | 9/1995 | Takado et al. ................. 355/53 |
| 5,667,922 A | * | 9/1997 | Martiska et al. ................ 430/9 |
| 5,685,895 A | * | 11/1997 | Hagiwara et al. .............. 96/117 |
| 5,890,367 A | * | 4/1999 | You et al. ........................ 62/78 |
| 5,944,894 A | * | 8/1999 | Kitano et al. ................ 118/326 |
| 6,096,267 A | * | 8/2000 | Kishkovich et al. .......... 422/52 |
| 6,097,469 A | * | 8/2000 | Yaegashi et al. .............. 355/30 |

FOREIGN PATENT DOCUMENTS

| | | | | |
|---|---|---|---|---|
| EP | 1050900 A1 | * | 11/2000 | ......... H01L/21/027 |
| JP | 2-131143 U | | 10/1990 | |
| JP | 06-020906 | | 1/1994 | |
| JP | 06208947 A | * | 7/1994 | ......... H01L/21/027 |
| JP | 06232017 A | * | 8/1994 | ........... H01L/21/02 |
| JP | 10149970 A | * | 6/1998 | ......... H01L/21/027 |

OTHER PUBLICATIONS

Hitachi Plant Technical Report, 1992, vol. 13.
11th Air Cleaning and Contamination Control Research Conference (C-13) Examination for Filter for Removing Harmful Gas that Influences Wafer (Second Report), 1992.
A. Saiki et al., "Clean Room Technology for Halfmicron LSI," Hitaci Hyoron, vol. 73, No. 9, 1991, pp. 83–90.

* cited by examiner

Primary Examiner—Stephen W. Smoot
(74) Attorney, Agent, or Firm—McDermott Will & Emery LLP (57) ABSTRACT

Environmental control equipment is provided for a developing apparatus for developing a light-exposed resist film with a developer in a wafer treating chamber. An air supply means, supplying air taken from outside into the wafer treating chamber, includes a chemical contaminant removal means for removing chemical contaminants from the air.

4 Claims, 5 Drawing Sheets

ENVIRONMENTAL CONTROL EQUIPMENT/METHOD OF DEVELOPING APPARATUS FOR DEVELOPING LIGHT-EXPOSED RESIST FILM WITH DEVELOPER IN WAFER TREATING CHAMBER

BACKGROUND OF THE INVENTION

The present invention relates to environmental control equipment of a developing apparatus used in a lithographic process and an environmental control method for the developing apparatus.

Higher levels of integration and performance of semiconductor integrated circuit devices have been realized by use of finer resist patterns in a lithographic process.

For formation of further fine resist patterns, it has become necessary to prevent generation of fine pattern defects and foreign particles of which existence has conventionally caused no problem.

Problems as follows will arise if foreign particles exist on a wafer or a film to be treated formed on a wafer. If foreign particles exist on a film to be treated, the foreign particles serve as a mask when the film is etched. Therefore, a residue may be formed at positions of the film that should be etched away. If foreign particles exist on a wafer, the foreign particles serve as a mask when the wafer is ion-implanted. Therefore, the ion-implanted wafer may have variations in implantation. These problems will result in deterioration in properties and reduction in yield of the resultant semiconductor devices.

To overcome the above problems, a chemical filter is conventionally provided for an air supply means for supplying air into a clean room.

Hereinafter, conventional environmental control equipment of a developing apparatus will be described with reference to FIG. 5.

Figure 5:
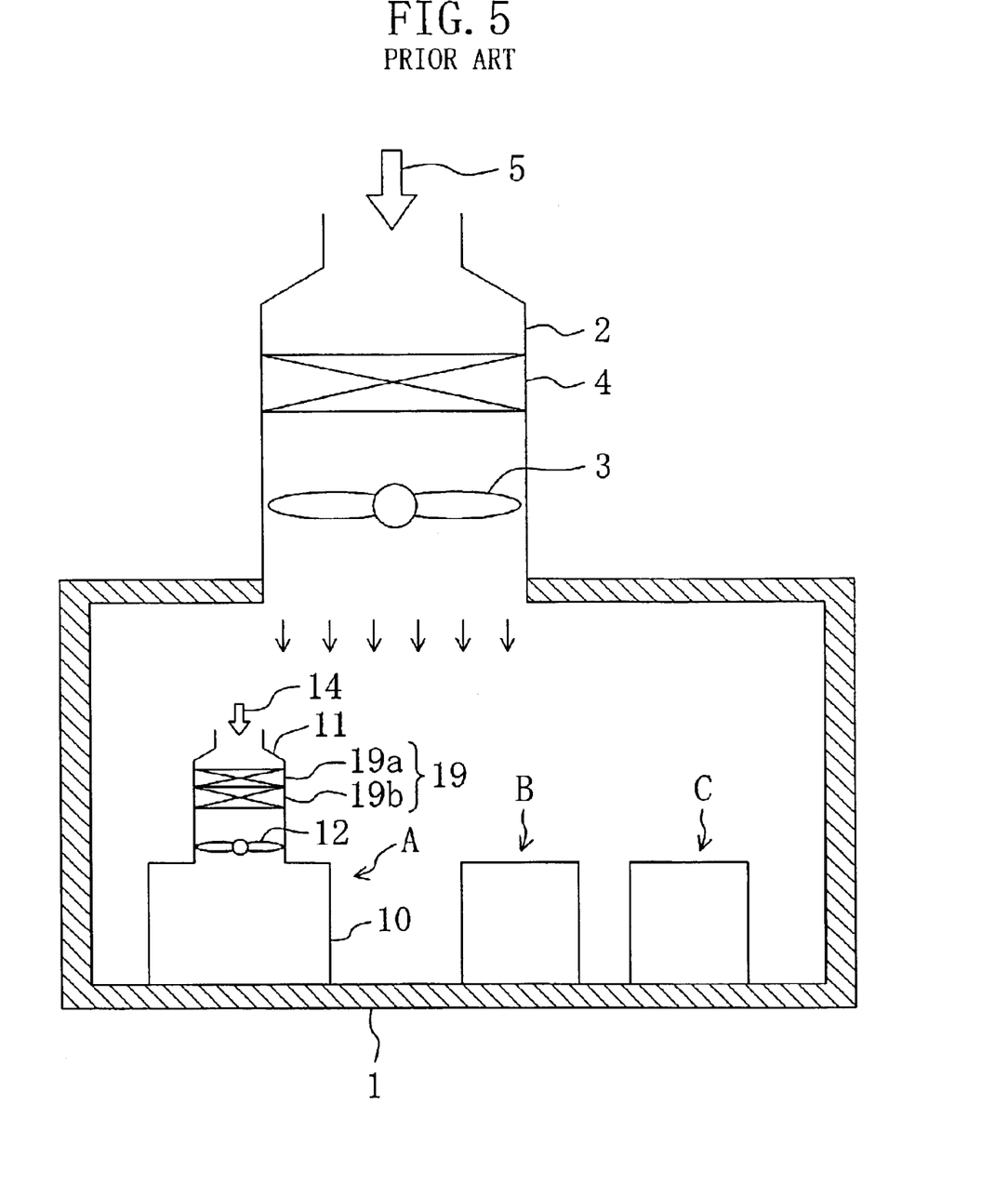
FIG. 5 is a schematic illustration of an entire clean room in which conventional environmental control equipment of a developing apparatus is placed.

Referring to FIG. 5, a developing apparatus A, a coating apparatus B and a cleaning apparatus C, for example, are installed inside a clean room 1. A clean room air supply means 2 is provided on the ceiling of the clean room 1 for supplying air into the clean room 1 from outside. The clean room air supply means 2 includes a clean room pressure fan 3 and a chemical filter 4. Chemical contaminants are therefore removed from air 5 taken from outside before the air 5 is supplied into the clean room 1.

The developing apparatus A has a wafer treating chamber 10. On the ceiling of the wafer treating chamber 10, provided is a developing apparatus air supply means 11, which includes a developing apparatus pressure fan 12 and a filter unit 19. The filter unit 19 is composed of a hygrothermal control system 19a and a HEPA filter 19b. Therefore, air 14, taken from outside, that is, taken from the inside of the clean room 1, is subjected to hygrothermal adjustment, and also particles having a size exceeding a predetermined value are removed from the air 14 before the air 14 is supplied into the wafer treating chamber 10.

For removal of chemical contaminants that may cause generation of fine pattern defects and foreign particles, techniques for providing various types of filters for a clean room have been proposed.

For example, Japanese Laid-Open Utility Model Publication No. 2-131143 describes the following. Air exhausted from a clean room is cleaned and then re-supplied into the clean room. Therefore, in case that toxic gas leaks in the clean room, the toxic gas will disadvantageously be circulated to re-enter the clean room. Also, in case that a contaminant such as $H_2S$, $SO_x$ and $NO_x$ exists in the atmosphere, even a trace amount of such a contaminant may adversely affect workers and fabrication apparatuses in the clean room because the contaminant is condensed during circulation. To prevent generation of fine pattern defects and foreign particles, the publication proposes a technique of placing a chemical filter for removing chemical contaminants including $SO_x$ and $NO_x$ in the clean room.

Hitachi Plant Gihou 1992, Vol. 13, pp. 4–8 describes the following. With progress in attainment of finer LSIs, a higher level of cleanliness has been required in the LSI fabrication process. In high-level cleanliness, even gaseous substances have come to be regarded as contaminants, in addition to particulate substances. Examples of such gaseous substances are gases such as $SO_x$ and $NO_x$ in outside air entering a clean room and trace acid gases such as hydrofluoric acid and hydrochloric acid generated from fabrication apparatuses installed inside the clean room. These contaminants are considered to adversely affect surfaces or interfaces of semiconductor layers in the LSI fabrication process. For trace acid gases in outside air entering the clean room, it is necessary to take measures such as providing a gas removal filter for an air conditioner installed in the clean room.

Preprint of 11th Study Meeting on Air Cleaning and Contamination Control, clauses 165–168 describes the following. Contaminants such as $SO_x$ and $NO_x$ contained in the atmosphere in trace amounts fail to be removed with a filter for particulates such as a HEPA filter or a ULPA filter. Therefore, these contaminants enter a clean room, and are said to adsorb to wafer surfaces and adversely affect the properties, the yield and the like of the resultant products. This will cause a greater problem as the level of integration of LSIs becomes higher. For elimination of these contaminants, there has increased the case of providing a contaminant removal filter for an outside air handling system of the clean room. As for $NH_3$ gas and acid gas generated in the clean room, an attempt has been made to remove such gas by providing a contaminant gas removal filter for a circulation system.

Hitachi Review, Vol. 73, No. 9 (1991–9) pp. 83–90 describes the following. In LSIs of the half-micron generation, atomic-order control is required for surfaces or interfaces of silicon layers. Not only dust particles but also chemical substances such as $SO_2$, HCl and HF are not allowed to exist in the LSI process environment. However, such chemical substances may pass through a HEPA filter, or chemical substances may leak out in the process environment, although in trace amounts, during handing of a chemical agent in a cleaning apparatus in the clean room, and attach to surfaces of silicon layers. The newly developed chemical filter is very effective in removal of these chemical substances.

In order to find a way of preventing generation of fine pattern defects and foreign particles, the present inventors examined the measures described above, in which a chemical filter or a contaminant gas removal filter is placed in a clean room. However, it was found that any of the above measures failed to ensure prevention of generation of fine pattern defects and foreign particles.

In view of the above, the present inventors took measures as follows. For removal of an undissolved residual component of a resist film or an impurity, heat treatment was performed with a hot plate, for example, after the developing process, to volatilize the impurity with heat for removal.

However, even by this heat treatment, foreign particles failed to be removed completely.

As another measures, the developing process was performed repeatedly. This changed the resist pattern, and thus is not an effective means.

SUMMARY OF THE INVENTION

An object of the present invention is ensuring reduction of the amount of foreign particles generated on a wafer or an object to be treated.

To attain the above object, the present inventors have made various examinations on the cause of generation of foreign particles in the lithographic process, and found that foreign particles are generated in the developing process in which a pattern-exposed resist film is developed.

To state more specifically, the present inventors have found the following. An aqueous tetramethylammoniumhydroxyd (TMAH) solution used as a developer in the developing process reacts with sulfur oxide ($SO_x$) in the ambient atmosphere, to produce salt as a reaction product. This salt constitutes the foreign particles. According to Raman spectroscopic analysis, the main component of the salt is $(CH_3)_3NSO_3$.

The basis for the determination that the main component of the salt is $(CH_3)_3NSO_3$ according to Raman spectroscopic analysis is that the analysis results match with those of the substance already registered in the profile of the Raman spectroscopic analysis results.

Since $(CH_3)_3NSO_3$ is unstable as salt, it is presumed that salt made of $((CH_3)_4N)_2SO_3$ is produced according to the following series of reactions.

TMAH is decomposed to produce a decomposition product as represented by the following equation.

$$N(CH_3)_4OH \rightarrow (CH_3)_4N^+ + OH^-$$

Sulfur oxide in the ambient atmosphere dissolves in the aqueous solution to generate sulfide ions as represented by the following equation.

$$SO_2 + H_2O \rightarrow SO_3^{2-} + 2H^+$$

The decomposition product and the sulfide ions react with each other to produce salt as represented by the following equation.

$$2((CH_3)_4N^+) + SO_3^{2-} \rightarrow ((CH_3)_4N)_2SO_3$$

The salt generated by the above reactions works as a mask. Therefore, with existence of the salt, a residue of a film may be left behind when the film is dry-etched, or variations in implantation may occur in a wafer when the wafer is ion-implanted.

The existence of the reaction product has also been confirmed when a normal resist, not the chemical amplification type resist, is used. Therefore, $SO_x$ in the ambient atmosphere is considered more influential than the sulfur component contained in an acid generator of the chemical amplification type resist.

From the fact that the reaction product is mainly produced by the reaction between $SO_x$ in the ambient atmosphere and TMAH, it has also been found that the number of foreign particles generated as the reaction product is greatly influenced by the combination of the concentration of $SO_x$ and the concentration of TMAH in the developing apparatus.

The present invention has been attained based on the findings described above.

Specifically, the present invention is directed to environmental control equipment of a developing apparatus for developing a light-exposed resist film with a developer in a wafer treating chamber. The equipment includes: air supply means for supplying air taken from outside into the wafer treating chamber; and chemical contaminant removal means provided for the air supply means, for removing a chemical contaminant from the air.

According to the environmental control equipment of a developing apparatus of the invention, the air supply means for supplying air from outside into the wafer treating chamber includes a chemical contaminant removal means for removing chemical contaminants. By this removal, the amount of chemical contaminants contained in the air supplied into the wafer treating chamber decreases. Therefore, during the development of the resist film, the number of foreign particles existing on the wafer or the film significantly decreases.

Accordingly, with a reduced amount of foreign particles working as a mask, it is possible to suppress the troubles that a residue is left behind at positions of the film that should be dry-etched when the film is subjected to selective dry etching, and that variations in implantation occur in the wafer when the wafer is subjected to ion implantation.

The environmental control equipment of a developing apparatus of the invention is effective when the contaminant is an impurity containing sulfur.

An impurity containing sulfur generates foreign particles by reacting with a component contained in the developer used for development of the resist film. By removing the impurity containing sulfur, generation of foreign particles can be prevented.

The environmental control equipment of a developing apparatus of the invention is effective when the chemical contaminant is an impurity containing sulfur and the developer is an alkaline aqueous solution.

The environmental control equipment of a developing apparatus of the invention is especially effective when the chemical contaminant is an impurity containing sulfur and the developer is an aqueous tetramethylammoniumhydroxyd solution.

An impurity containing sulfur reacts with a component contained in the aqueous tetramethylammoniumhydroxyd solution to produce salt represented by $((CH_3)_4N)_2SO_3$. By removing the impurity containing sulfur, generation of foreign particles made of the salt represented by $((CH_3)_4N)_2SO_3$ can be prevented.

In the above case, preferably, the concentration of the aqueous tetramethylammoniumhydroxyd solution is 2.38 wt. % or less, and the chemical contaminant removal means removes the impurity containing sulfur so that the concentration of the impurity containing sulfur in the air is 0.5 $\mu g/m^3$ or less.

By the above setting, prevention of generation of foreign particles is ensured.

Preferably, the chemical contaminant removal means removes the impurity containing sulfur so that the concentration of the impurity containing sulfur in the air is 0.4 $\mu g/m^3$ or less.

By the above setting, prevention of generation of foreign particles is ensured even when the concentration of the aqueous tetramethylammoniumhydroxyd solution exceeds the value normally adopted, that is, 2.38 wt. %.

Preferably, the chemical contaminant removal means includes means for controlling the concentration of the impurity containing sulfur in the air. An example of the means for controlling the concentration of the impurity containing sulfur is a means for controlling the mass of a chemical filter having activated carbon. By providing this means, the concentration of the impurity can be controlled.

Alternatively, the present invention is directed to an environmental control method for a developing apparatus for developing a light-exposed resist film with a developer in a wafer treating chamber. The method includes the steps of: supplying air taken from outside into the wafer treating chamber; and removing a chemical contaminant from the air.

According to the environmental control method for a developing apparatus of the invention, chemical contaminants are removed from air when the air is supplied from outside into the wafer treating chamber. By this removal, the amount of chemical contaminants contained in the air supplied into the wafer treating chamber decreases. Therefore, during the development of the resist film, the number of foreign particles existing on the wafer or the film significantly decreases.

Accordingly, with a reduced amount of foreign particles working as a mask, it is possible to suppress the troubles that a residue is left behind at positions of the film that should be dry-etched when the film is subjected to selective dry etching, and that variations in implantation occur in the wafer when the wafer is subjected to ion implantation.

The environmental control method for a developing apparatus of the invention is effective when the contaminant is an impurity containing sulfur.

An impurity containing sulfur generates foreign particles by reacting with a component contained in a developer used for development of the resist film. By removing the impurity containing sulfur, generation of foreign particles can be prevented.

The environmental control method for a developing apparatus of the invention is effective when the chemical contaminant is an impurity containing sulfur and the developer is an alkaline aqueous solution.

The environmental control method for a developing apparatus of the invention is especially effective when the chemical contaminant is an impurity containing sulfur and the developer is an aqueous tetramethylammoniumhydroxyd solution.

An impurity containing sulfur reacts with a component contained in the aqueous tetramethylammoniumhydroxyd solution to produce salt represented by $((CH_3)_4N)_2SO_3$. By removing the impurity containing sulfur, generation of foreign particles made of the salt represented by $((CH_3)_4N)_2SO_3$ can be prevented.

In the above case, preferably, the concentration of the aqueous tetramethylammoniumhydroxyd solution is 2.38 wt. % or less, and the step of removing a chemical contaminant comprises the step of removing the impurity containing sulfur so that the concentration of the impurity containing sulfur in the air is 0.5 $\mu g/m^3$ or less.

By the above setting, prevention of generation of foreign particles is ensured.

Preferably, the step of removing a chemical contaminant includes the step of removing the impurity containing sulfur so that the concentration of the impurity containing sulfur in the air is 0.4 $\mu g/m^3$ or less.

By the above setting, prevention of generation of foreign particles is ensured even when the concentration of the aqueous tetramethylammoniumhydroxyd solution exceeds the value normally adopted, that is, 2.38 wt. %.

Preferably, the step of removing a chemical contaminant includes the step of controlling the concentration of the impurity containing sulfur in the air. An example of the way of controlling the concentration of the impurity containing sulfur is control of the mass of a chemical filter having activated carbon. By this control, the concentration of the impurity can be controlled.

DESCRIPTION OF THE PREFERRED EMBODIMENTS

Embodiment 1

Hereinafter, environmental control equipment of a developing apparatus and an environmental control method for the developing apparatus in Embodiment 1 of the present invention will be described with reference to FIGS. 1, 2 and 3.

Figure 1:
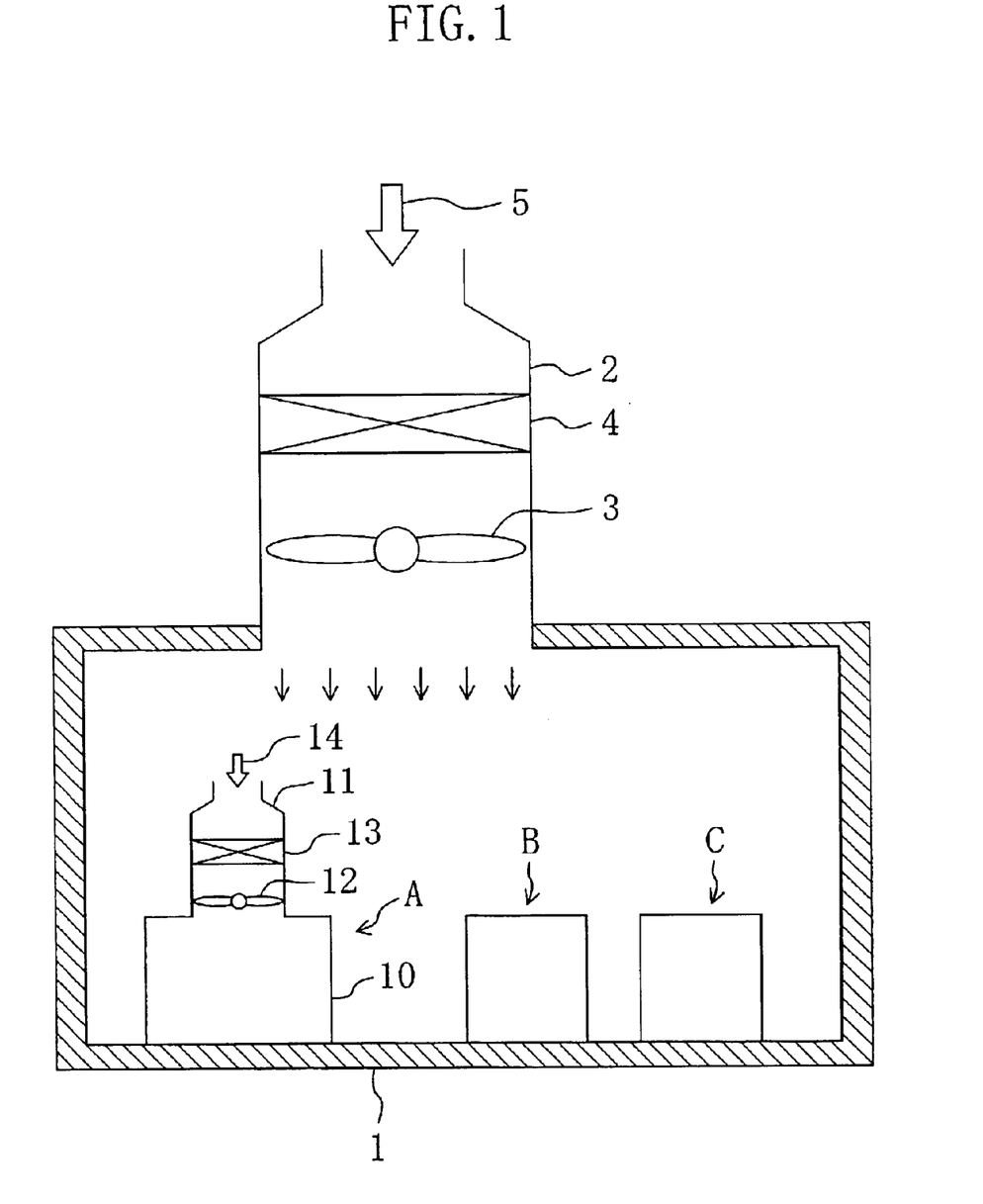
FIG. 1 is a schematic illustration of an entire clean room in which environmental control equipment of a developing apparatus of Embodiment 1 or 2 of the present invention is placed.

FIG. 1 schematically illustrates an entire clean room including environmental control equipment of a developing apparatus of Embodiment 1 of the present invention. Referring to FIG. 1, a developing apparatus A, a coating apparatus B and a cleaning apparatus C are installed in a clean room 1. A clean room air supply means 2 is provided on the ceiling of the clean room 1 for supplying air into the clean room 1 from outside. The clean room air supply means 2 includes a clean room pressure fan 3 and a chemical filter 4. Chemical contaminants are therefore removed from air 5 taken from outside before the air 5 is supplied into the clean room 1.

The developing apparatus A has a wafer treating chamber 10. On the ceiling of the wafer treating chamber 10, provided is a developing apparatus air supply means 11, which includes a developing apparatus pressure fan 12 and a filter unit 13. Air 14, taken from outside, that is, from the inside of the clean room 1 by the force of the developing apparatus pressure fan 12, passes through the filter unit 13 before being supplied into the wafer treating chamber 10.

Figure 2:
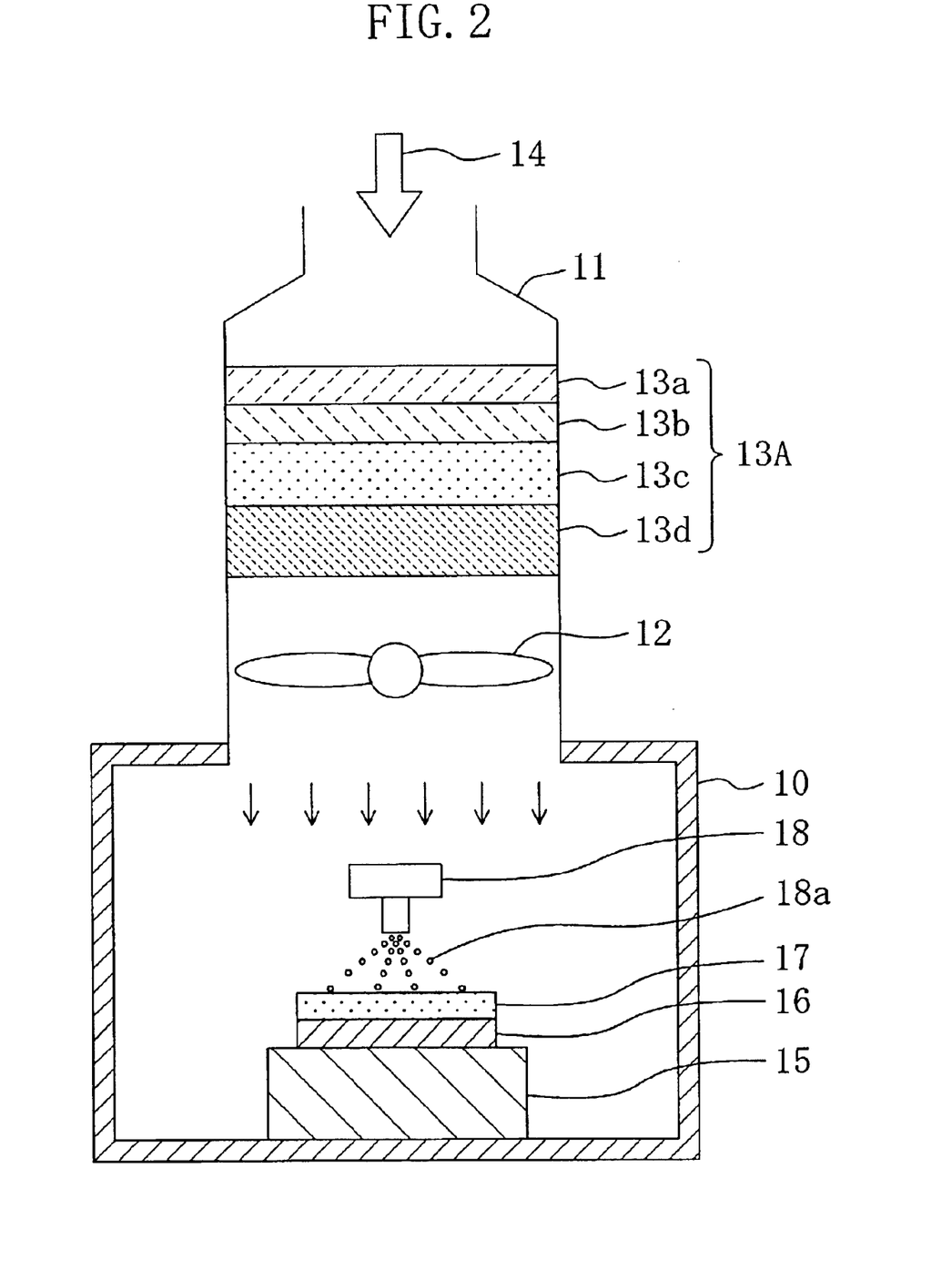
FIG. 2 is a cross-sectional view of the environmental control equipment of the developing apparatus of Embodiment 1 of the present invention.

Referring to FIG. 2, a sample stage 15 is installed on the bottom of the wafer treating chamber 10 of the developing apparatus A. A wafer 16 with a resist film 17 formed thereon is placed on the sample stage 15.

A developer feed means 18 is placed at a position opposing the wafer 16 in the wafer treating chamber 10, so that a developer 18a is fed from the developer feed means 18 into the resist film 17. The resist film 17 infiltrated with the developer 18a is thus developed, forming a resist pattern.

The filter unit in this embodiment, denoted by 13A, includes a first chemical filter 13a for removal of amine impurities, a second chemical filter 13b for removal of sulfur impurities, a hygrothermal control system 13c and a HEPA filter 13d, placed sequentially in this order from the side closer to the outside (from the side opposite to the wafer treating chamber 10).

The first chemical filter 13a is provided to remove amine impurities from the air 14 taken from outside when the resist film 17 is made of a chemical amplification type resist material. Amine impurities may otherwise block reaction of acid generated from the chemical amplification type resist material. As an adsorbent for removing amine impurities, a chemical adsorbent made of activated carbon with a reductant added thereto may be used.

The second chemical filter 13b is provided to remove sulfur oxides in the ambient atmosphere and sulfur components contained in an acid generator of the chemical amplification type resist (hereinafter, such sulfur oxides and sulfur components are collectively called sulfur impurities) from the air 14 taken from outside. As an adsorbent for removing sulfur impurities, a chemical adsorbent made of activated carbon with potassium carbonate added thereto may be used.

In the second chemical filter 13b, the amount of the chemical adsorbent is adjusted so that the concentration of the sulfur impurities in the air 14 taken from outside is as low as 0.4 $\mu m/m^3$ or less in consideration of the conditions such as the flow rate, temperature and humidity of the air 14.

The hygrothermal control system 13c is provided to adjust the temperature and humidity of the air 14 taken from outside.

The HEPA filter 13d is provided to remove particles having a size exceeding a predetermined value from the air 14 taken from outside.

The reason why the concentration of the sulfur impurities in the air 14 to be supplied into the wafer treating chamber 10 is controlled to be 0.4 $\mu m/m^3$ or less will be described with reference to FIG. 3.

Figure 3:
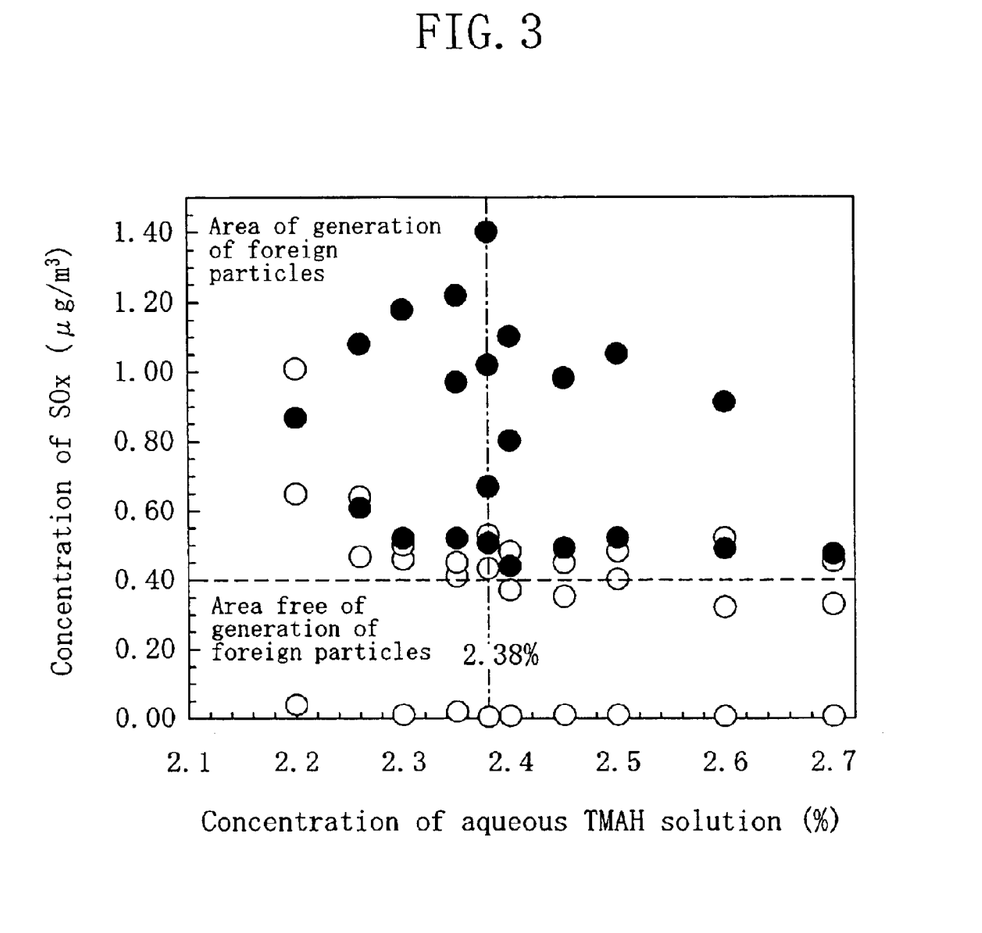
FIG. 3 is a view showing the relationship between the concentrations of $SO_x$ and an aqueous TMAH solution in a wafer treating chamber and the generation of foreign particles, observed when a resist film is developed with the aqueous TMAH solution in the developing apparatus provided with the environmental control equipment of Embodiment 1.

FIG. 3 shows the relationship between the concentrations of $SO_x$ and an aqueous TMAH solution in the wafer treating chamber 10 and the generation of foreign particles, observed when the resist film 17 placed in position in the wafer treating chamber 10 is developed with the aqueous TMAH solution as the developer 18a. The resist film 17 is made of a chemical amplification type resist and has been pattern-exposed. An experiment for this observation was performed in the following manner.

First, a positive chemical amplification type resist is applied to the wafer 16 to form the resist film 17. The chemical amplification type resist is made of a polyhydroxy styrene derivative as a polymer, an acetal group as a protection group and a diazomethane compound as an acid generator. The resist film 17 is then prebaked with a hot plate at 90° C. for 90 seconds, and thereafter subjected to pattern-exposure with a KrF excimer laser stepper.

Thereafter, the pattern-exposed resist film 17 is placed in the wafer treating chamber 10 in which the concentration of $SO_x$ in the air 14 supplied therein can be adjusted with the filter unit 13A. In the wafer treating chamber 10, after being post-baked with a hot plate at 120° C. for 90 seconds, the resist film 17 is developed with the aqueous TMAH solution in varying concentrations, to form resist patterns.

The number of foreign particles having a diameter of 0.1 $\mu m$ or more existing on each of the resultant resist patterns was counted with an automatic wafer defect inspection apparatus (KLA2139 from KLA-Tencor Corporation).

In FIG. 3, the white circles represent the case that substantially no foreign particles were generated (the number of foreign particles on the wafer was less than 60), and the black circles represent the case that a considerable amount of foreign particles were generated (the number of foreign particles on the wafer was 60 or more).

From FIG. 3, it is found that (1) as the concentration of the aqueous TMAH solution is lower and the concentration of $SO_x$ is lower, generation of foreign particles decreases, (2) when the concentration of the aqueous TMAH solution is equal to or less than 2.38 wt. %, which is the concentration normally adopted for this solution, substantially no foreign particles are generated as long as the concentration of $SO_x$ is 0.50 $\mu g/m^3$ or less, and (3) when the concentration of $SO_x$ is 0.40 $\mu g/m^3$ or less, substantially no foreign particles are generated even if the concentration of the aqueous TMAH solution is more than 2.38 wt. %.

Accordingly, when the concentration of the aqueous TMAH solution is 2.38 wt. % or less, substantially no foreign particles will be generated by controlling the concentration of $SO_x$ to 0.50 $\mu g/m^3$ or less. Otherwise, by controlling the concentration of $SO_x$ to 0.40 $\mu g/m^3$ or less, substantially no foreign particles will be generated even if the concentration of the aqueous TMAH solution is more than 2.38 wt. %.

Thus, in Embodiment 1, in which the developing apparatus air supply means 11 includes the filter unit 13A having the first chemical filter 13a and the second chemical filter 13b, generation of foreign particles can be effectively prevented.

To state more specifically, the chemical filter 4 provided for the clean room 1 fails to control the types and concentrations of individual impurities to deal with problems uniquely arising in respective processes using the semiconductor fabrication apparatuses such as the developing apparatus A, the coating apparatus B and the cleaning apparatus C.

In Embodiment 1, however, it is possible to individually deal with a unique problem of preventing generation of foreign particles in the developing apparatus A.

In addition, the problem of preventing generation of foreign particles can be solved at considerably low cost compared with the control with the chemical filter 4 for the entire clean room 1.

In Embodiment 1, the filter unit 13A is placed on the side of the developing apparatus pressure fan 12 opposite to the wafer treating chamber 10. Alternatively, the filter unit 13A may be placed on the side of the developing apparatus pressure fan 12 facing the wafer treating chamber 10.

In Embodiment 1, although the first chemical filter 13a, the second chemical filter 13b, the hygrothermal control system 13c and the HEPA filter 13d of the filter unit 13A are placed in this order from the side closer to the outside, the placement is not limited to this order.

In Embodiment 1, the first chemical filter 13a for removal of amine impurities and the second chemical filter 13b for removal of sulfur impurities are separately provided. Alternatively, a chemical filter combining these filters may be provided.

EXAMPLE 1 AND COMPARATIVE EXAMPLE 1

Hereinafter, Example 1 as an actual example of Embodiment 1 and Comparative Example 1 for evaluation of Example 1 will be described.

For both Example 1 and Comparative Example 1, a positive chemical amplification type resist is applied to the wafer 16 to form the resist film 17. The chemical amplification type resist is made of a polyhydroxy styrene derivative as a polymer, an acetal group as a protection group and a diazomethane compound as an acid generator. The resist film 17 is then prebaked with a hot plate at 90° C. for 90 seconds, and thereafter subjected to pattern-exposure with a KrF excimer laser stepper.

Thereafter, in Example 1, the pattern-exposed resist film 17 is placed in the wafer treating chamber 10 in which the concentration of $SO_x$ in the air 14 supplied therein is adjusted to 0.50 μg/m³ or less with the filter unit 13A. In the wafer treating chamber 10, after being post-baked with a hot plate at 120° C. for 90 seconds, the resist film 17 is developed with a 2.38 wt. % aqueous TMAH solution to form a resist pattern.

In Comparative Example 1, the pattern-exposed resist film is placed in the wafer treating chamber 10 shown in FIG. 5. After being post-baked with a hot plate at 120° C. for 90 seconds, the resist film is developed with a 2.38 wt. % aqueous TMAH solution to form a resist pattern.

TABLE 1

|  | Comparative Example 1 | Example 1 |
| --- | --- | --- |
| Concentration of sulfur impurities (μg/m³) | 4.8 (5.3) | 0.3 (5.3) |
| Number of foreign particles (pcs.) | 3000 | 50 |

Table 1 shows the concentration of sulfur impurities in the wafer treating chamber 10 and the number of foreign particles existing on the resultant resist pattern for Example 1 and Comparative Example 1. This experiment was performed by counting the number of foreign particles having a diameter of 0.1 μm or more with an automatic wafer defect inspection apparatus (KLA2139 from KLA-Tencor Corporation).

As is found from Table 1, while the number of foreign particles is 3000 in Comparative Example 1, it is 50 in Example 1. It was therefore confirmed that the number of foreign particles greatly decreased.

EXAMPLE 2 AND COMPARATIVE EXAMPLE 2

Hereinafter, Example 2 as another actual example of Embodiment 1 and Comparative Example 2 for evaluation of Example 2 will be described.

For both Example 2 and Comparative Example 2, a positive chemical amplification type resist is applied to the wafer 16 to form the resist film 17. The chemical amplification type resist is made of a polyhydroxy styrene derivative as a polymer, an acetal group as a protection group and onium salt as an acid generator. The resist film 17 is then prebaked with a hot plate at 90° C. for 90 seconds, and thereafter subjected to pattern-exposure with a KrF excimer laser stepper.

Thereafter, in Example 2, the pattern-exposed resist film 17 is placed in the wafer treating chamber 10 in which the concentration of $SO_x$ in the air 14 supplied therein is adjusted to 0.50 μg/m³ or less with the filter unit 13A. In the wafer treating chamber 10, after being post-baked with a hot plate at 120° C. for 90 seconds, the resist film 17 is developed with a 2.38 wt. % aqueous TMAH solution to form a resist pattern.

In Comparative Example 2, the pattern-exposed resist film is placed in the wafer treating chamber 10 shown in FIG. 5. After being post-baked with a hot plate at 120° C. for 90 seconds, the resist film is developed with a 2.38 wt. % aqueous TMAH solution to form a resist pattern.

TABLE 2

|  | Comparative Example 1 | Example 1 |
| --- | --- | --- |
| Concentration of sulfur impurities (μg/m³) | 5.4 (5.8) | 0.3 (5.8) |
| Number of foreign particles (pcs.) | 1000 | 35 |

Table 2 shows the concentration of sulfur impurities in the wafer treating chamber 10 and the number of foreign particles existing on the resultant resist pattern for Example 2 and Comparative Example 2. This experiment was performed by counting the number of foreign particles having a diameter of 0.1 μm or more with an automatic wafer defect inspection apparatus (KLA2139 from KLA-Tencor Corporation).

As is found from Table 2, while the number of foreign particles is 1000 in Comparative Example 2, it is 35 in Example 2. It was therefore confirmed that the number of foreign particles greatly decreased.

Embodiment 2

Hereinafter, environmental control equipment of a developing apparatus and an environmental control method for the developing apparatus in Embodiment 2 of the present invention will be described with reference to FIG. 4.

The entire construction of the environmental control equipment of the developing apparatus of Embodiment 2 is the same as that of Embodiment 1 described above with reference to FIG. 1, and thus the description thereof is omitted here.

Figure 4:
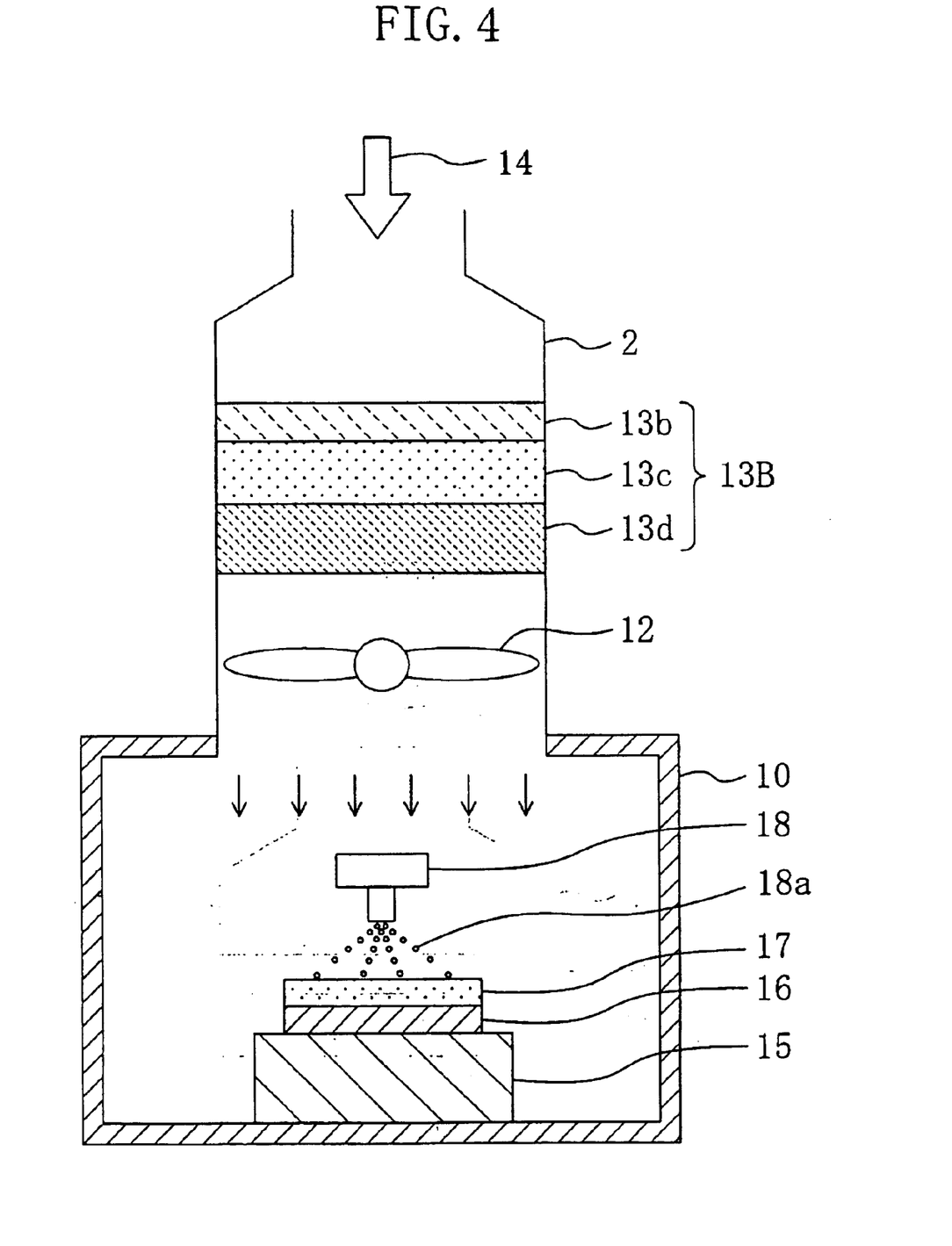
FIG. 4 is a cross-sectional view of the environmental control equipment of the developing apparatus of Embodiment 2 of the present invention.

Referring to FIG. 4, a sample stage 15 is installed on the bottom of the wafer treating chamber 10 of the developing apparatus A. A wafer 16 with a resist film 17 formed thereon is placed on the sample stage 15.

A developer feed means 18 is placed at a position opposing the wafer 16 in the wafer treating chamber 10, so that a developer 18a is fed from the developer feed means 18 into the resist film 17. The resist film 17 infiltrated with the developer 18a is thus developed, forming a resist pattern.

The filter unit in this embodiment, denoted by 13B, includes a second chemical filter 13b for removal of sulfur impurities, a hygrothermal control system 13c and a HEPA filter 13d, placed sequentially in this order from the side closer to the outside (from the side opposite to the wafer treating chamber 10).

The second chemical filter 13b is provided to remove sulfur oxides in the ambient atmosphere and sulfur components contained in an acid generator of the chemical amplification type resist (hereinafter, such sulfur oxides and sulfur components are collectively called sulfur impurities) from the air 14 taken from outside. As an adsorbent for removing sulfur impurities, a chemical adsorbent made of activated carbon with potassium carbonate added thereto may be used.

In the second chemical filter 13b, the amount of the chemical adsorbent is adjusted so that the concentration of the sulfur impurities in the air 14 taken from outside is as low as 0.4 μm/m³ or less in consideration of the conditions such as the flow rate, temperature and humidity of the air 14.

The hygrothermal control system 13c is provided to adjust the temperature and humidity of the air 14 taken from outside.

The HEPA filter 13d is provided to remove particles having a size exceeding a predetermined value from the air 14 taken outside.

The first chemical filter 13a (see FIG. 2) for removal of amine impurities can be omitted as in Embodiment 2 when a chemical amplification type resist is not used as the resist film 17 or when a chemical amplification type resist is subjected to the process steps of exposure, post-exposure baking and development in temporal succession.

EXAMPLE 3 AND COMPARATIVE EXAMPLE 3

Hereinafter, Example 3 as an actual example of Embodiment 2 and Comparative Example 3 for evaluation of Example 3 will be described.

For both Example 3 and Comparative Example 3, a resist containing a novolac resin as a polymer is applied to the wafer 16 to form the resist film 17. The resist film 17 is then prebaked with a hot plate at 90° C. for 90 seconds, and thereafter subjected to pattern-exposure with an i-line stepper.

Thereafter, in Example 3, the pattern-exposed resist film 17 is placed in the wafer treating chamber 10 in which the concentration of $SO_x$ in the air 14 supplied therein is controlled to 0.50 $\mu g/m^3$ or less with the filter unit 13B. In the wafer treating chamber 10, after being post-baked with a hot plate at 120° C. for 90 seconds, the resist film 17 is developed with a 2.38 wt. % aqueous TMAH solution to form a resist pattern.

In Comparative Example 3, the pattern-exposed resist film is placed in the wafer treating chamber 10 shown in FIG. 5. After being post-baked with a hot plate at 120° C. for 90 seconds, the resist film is developed with a 2.38 wt. % aqueous TMAH solution to form a resist pattern.

TABLE 3

|  | Comparative Example 1 | Example 1 |
| --- | --- | --- |
| Concentration of sulfur impurities ($\mu g/m^3$) | 4.9 (5.1) | 0.3 (5.1) |
| Number of foreign particles (pcs.) | 500 | 20 |

Table 3 shows the concentration of sulfur impurities in the wafer treating chamber 10 and the number of foreign particles existing on the resultant resist pattern for Example 3 and Comparative Example 3. This experiment was performed by counting the number of foreign particles having a diameter of 0.1 $\mu m$ or more with an automatic wafer defect inspection apparatus (KLA2139 from KLA-Tencor Corporation).

As is found from Table 3, while the number of foreign particles is 500 in Comparative Example 3, it is 20 in Example 3. It was therefore confirmed that the number of foreign particles greatly decreased.

In Embodiments 1 and 2, a positive resist was used. It is evident that the same effect of preventing generation of foreign particles is also obtained in the case of using a negative resist because foreign particles are generated by reaction between TMAH and $SO_x$ in the developing process.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. An environmental control equipment of a developing apparatus for developing a light-exposed resist film with a developer in a wafer treating chamber, the equipment comprising:

air supply means for supplying air taken from outside into the wafer treating chamber; and chemical contaminant removal means provided for the air supply means, for removing a chemical contaminant from the air;

wherein the chemical contaminant is an impurity containing sulfur, and the developer is an aqueous tetramethylammoniumhydroxyd solution; and the concentration of the aqueous tetramethylammoniumhydroxyd solution is 2.38 wt. % or less, and the chemical contaminant removal means removes the impurity containing sulfur so that the concentration of the impurity containing sulfur in the air is 0.5 $\mu g/m^3$ or less.

2. An environmental control equipment of a developing apparatus for developing a light-exposed resist film with a developer in a wafer treating chamber, the equipment comprising:

air supply means for supplying air taken from outside into the wafer treating chamber; and chemical contaminant removal means provided for the air supply means, for removing a chemical contaminant from the air;

wherein the chemical contaminant is an impurity containing sulfur, and the developer is an aqueous tetramethylammoniumhydroxyd solution; and the chemical contaminant removal means removes the impurity containing sulfur so that the concentration of the impurity containing sulfur in the air is 0.4 $\mu g/m^3$ or less.

3. An environmental control method for a developing apparatus for developing a light-exposed resist film with a developer in a wafer treating chamber, the method comprising the steps of:

supplying air taken from outside into the wafer treating chamber; and removing a chemical contaminant from the air;

wherein the chemical contaminant is an impurity containing sulfur, and the developer is an aqueous tetramethylammoniumhydroxyd solution; and the concentration of the aqueous tetramethylammoniumhydroxyd solution is 2.38 wt. % or less, and the step of removing a chemical contaminant comprises the step of removing the impurity containing sulfur so that the concentration of the impurity containing sulfur in the air is 0.5 $\mu g/m^3$ or less.

4. An environmental control method for a developing apparatus for developing a light-exposed resist film with a developer in a wafer treating chamber, the method comprising the steps of:

supplying air taken from outside into the wafer treating chamber; and removing a chemical contaminant from the air;

wherein the chemical contaminant is an impurity containing sulfur, and the developer is an aqueous tetramethylammoniumhydroxyd solution; and the step of removing a chemical contaminant comprises the step of removing the impurity containing sulfur so that the concentration of the impurity containing sulfur in the air is 0.4 $\mu g/m^3$ or less.

* * * * *